(12) United States Patent
Lee et al.

(10) Patent No.: US 10,806,044 B1
(45) Date of Patent: Oct. 13, 2020

(54) BOARD STRUCTURE AND ELECTRONIC DEVICE

(71) Applicant: Wistron NeWeb Corporation, Hsinchu (TW)

(72) Inventors: Hung-Wei Lee, Hsinchu (TW); Tung-Yi Chen, Hsinchu (TW); Cheng-Wei Yeh, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 16/708,512

(22) Filed: Dec. 10, 2019

(30) Foreign Application Priority Data

Mar. 29, 2019 (TW) .............................. 108111390 A

(51) Int. Cl.
| | |
|---|---|
| *H05K 5/06* | (2006.01) |
| *H05K 5/02* | (2006.01) |
| *B60Q 1/50* | (2006.01) |
| *B60R 13/10* | (2006.01) |
| *H05K 5/00* | (2006.01) |

(52) U.S. Cl.
CPC ............. *H05K 5/069* (2013.01); *B60Q 1/503* (2013.01); *B60R 13/105* (2013.01); *H05K 5/0017* (2013.01); *H05K 5/0247* (2013.01)

(58) Field of Classification Search
CPC ............................ H05K 5/069; H05K 5/0247
USPC ......................................................... 174/520
See application file for complete search history.

(56) References Cited

U.S. PATENT DOCUMENTS

| | | | | |
|---|---|---|---|---|
| 4,945,193 A | * | 7/1990 | Oikawa ................ | H01B 17/303 174/153 G |
| 6,822,165 B2 | | 11/2004 | Nishimoto | |
| 2003/0014924 A1 | * | 1/2003 | Nakamura .......... | B60R 13/0846 52/1 |
| 2014/0000937 A1 | * | 1/2014 | Alfier ................... | H01B 17/265 174/153 R |

FOREIGN PATENT DOCUMENTS

CN 108736408 A 11/2018

* cited by examiner

*Primary Examiner* — Sherman Ng
(74) *Attorney, Agent, or Firm* — McCure, Qualey & Rodack, LLP

(57) ABSTRACT

A board structure for a cable passing therethrough includes a board body and a grommet. The board body includes a board hole and a first inner protrusion portion. A minimum diameter of the board hole is a diameter located corresponding to the first inner protrusion portion of the board hole. The grommet is made of an elastic material and disposed in the board hole. The grommet includes a grommet hole and an outer annular wall. The outer annular wall is connected to the first inner protrusion portion. The grommet hole is for the cable passing therethrough and coaxially disposed with the board hole. A diameter of the grommet hole is smaller than the minimum diameter of the board hole.

14 Claims, 15 Drawing Sheets

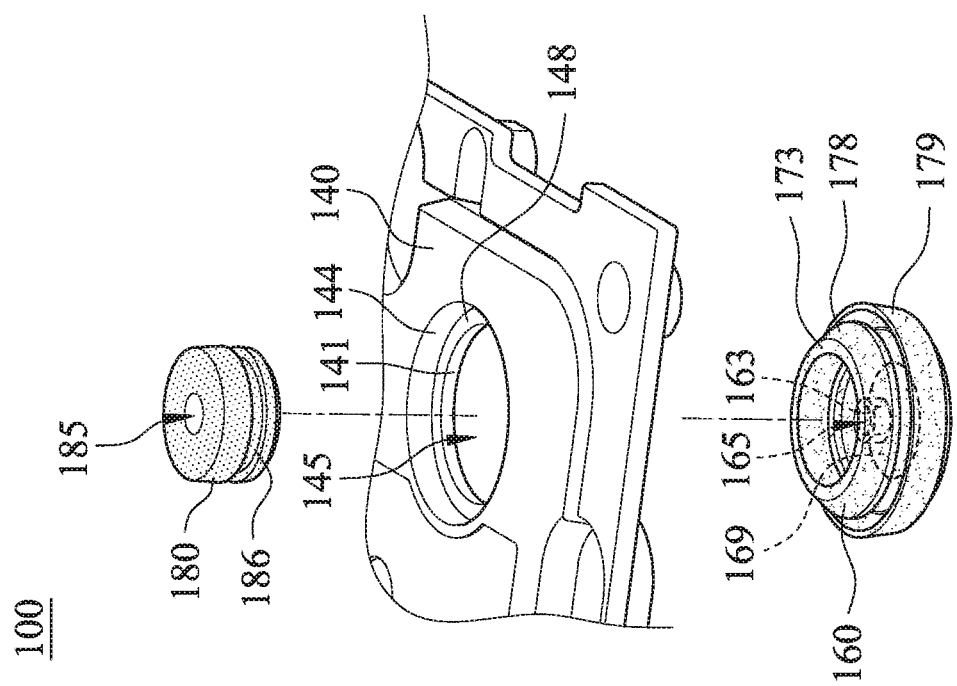
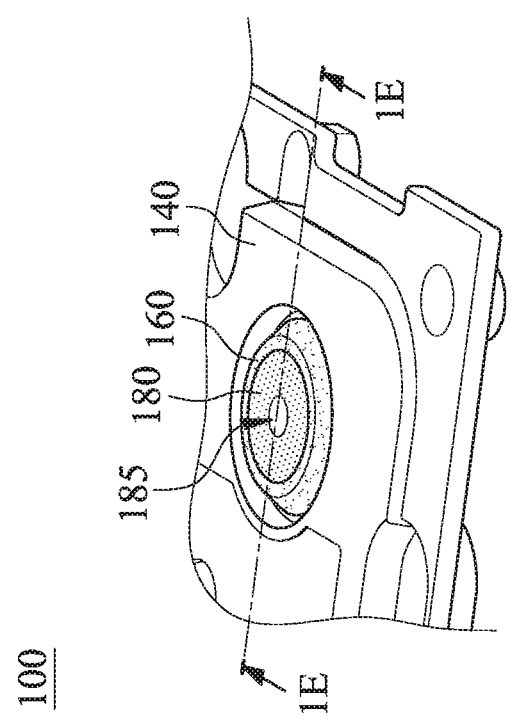
Fig. 1D
Fig. 1C

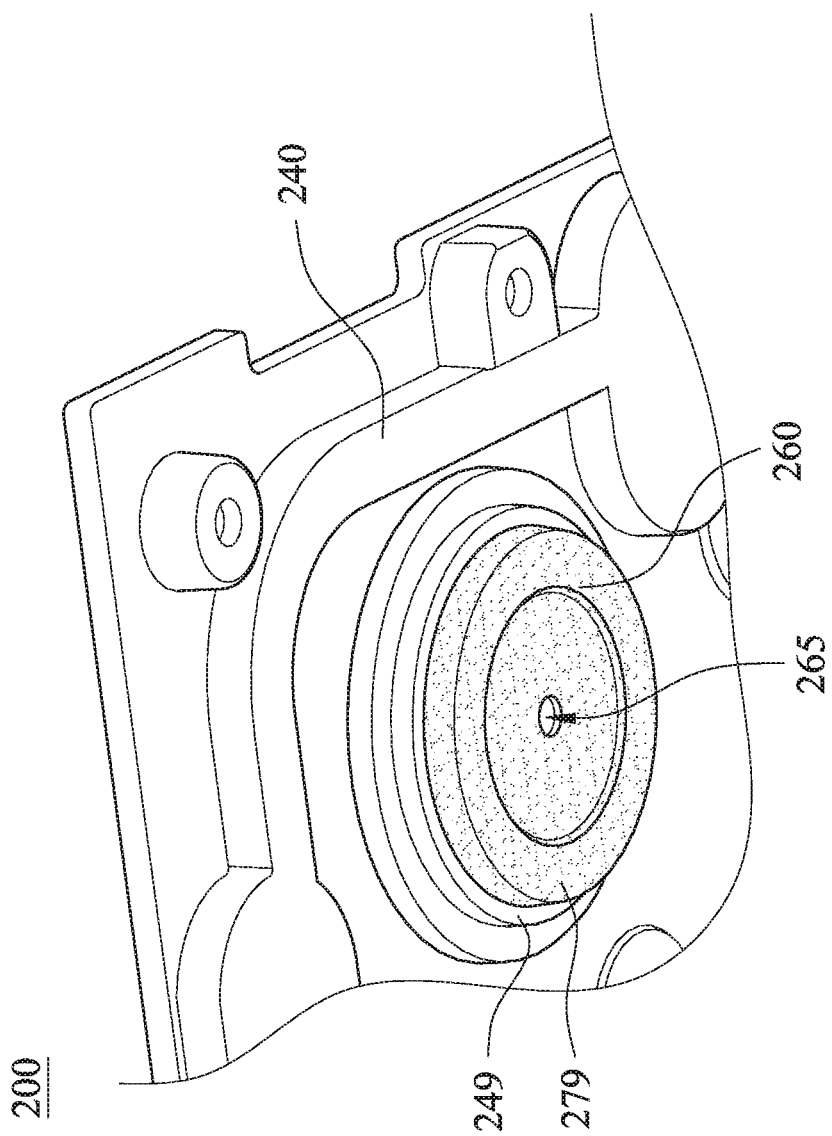

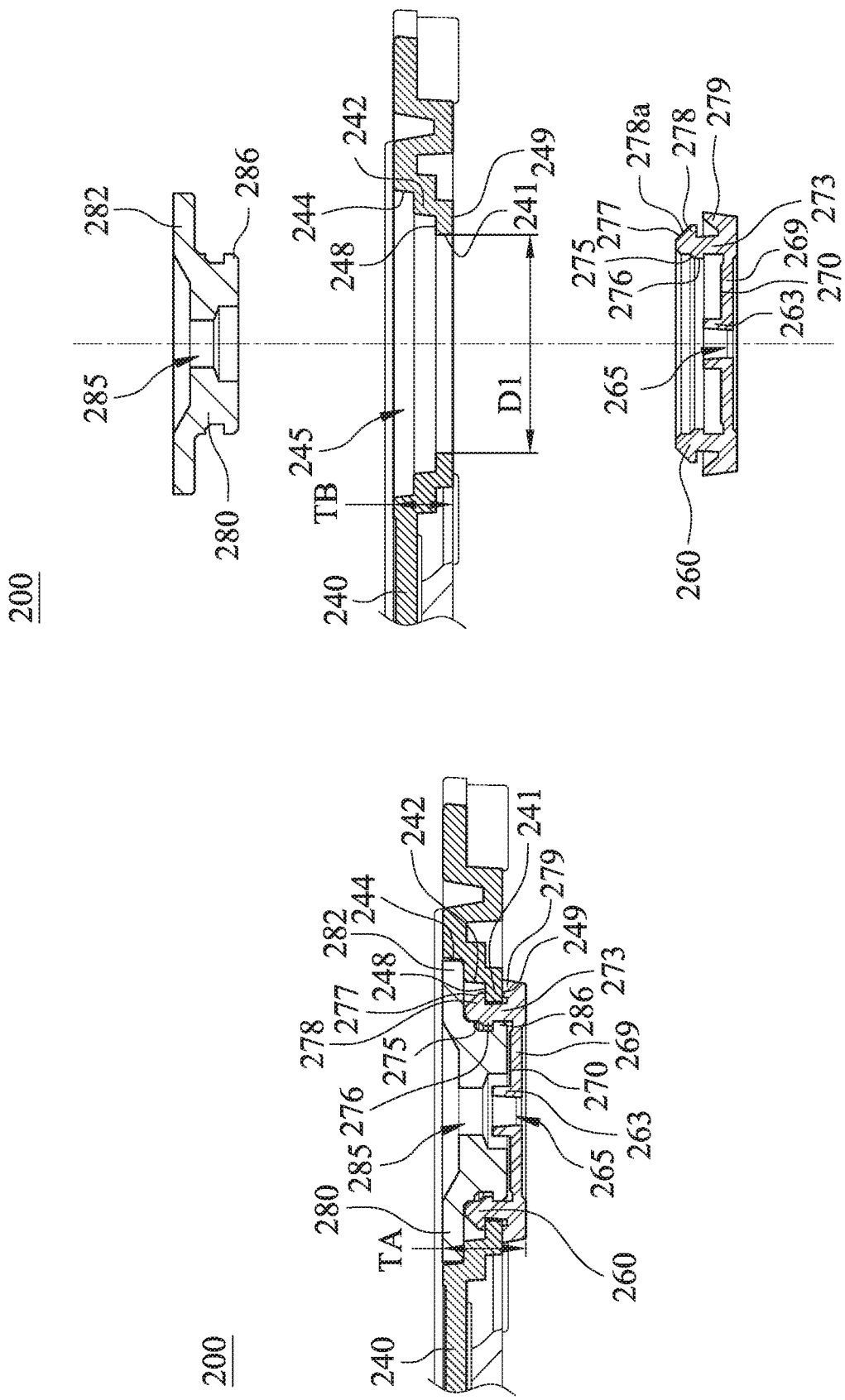

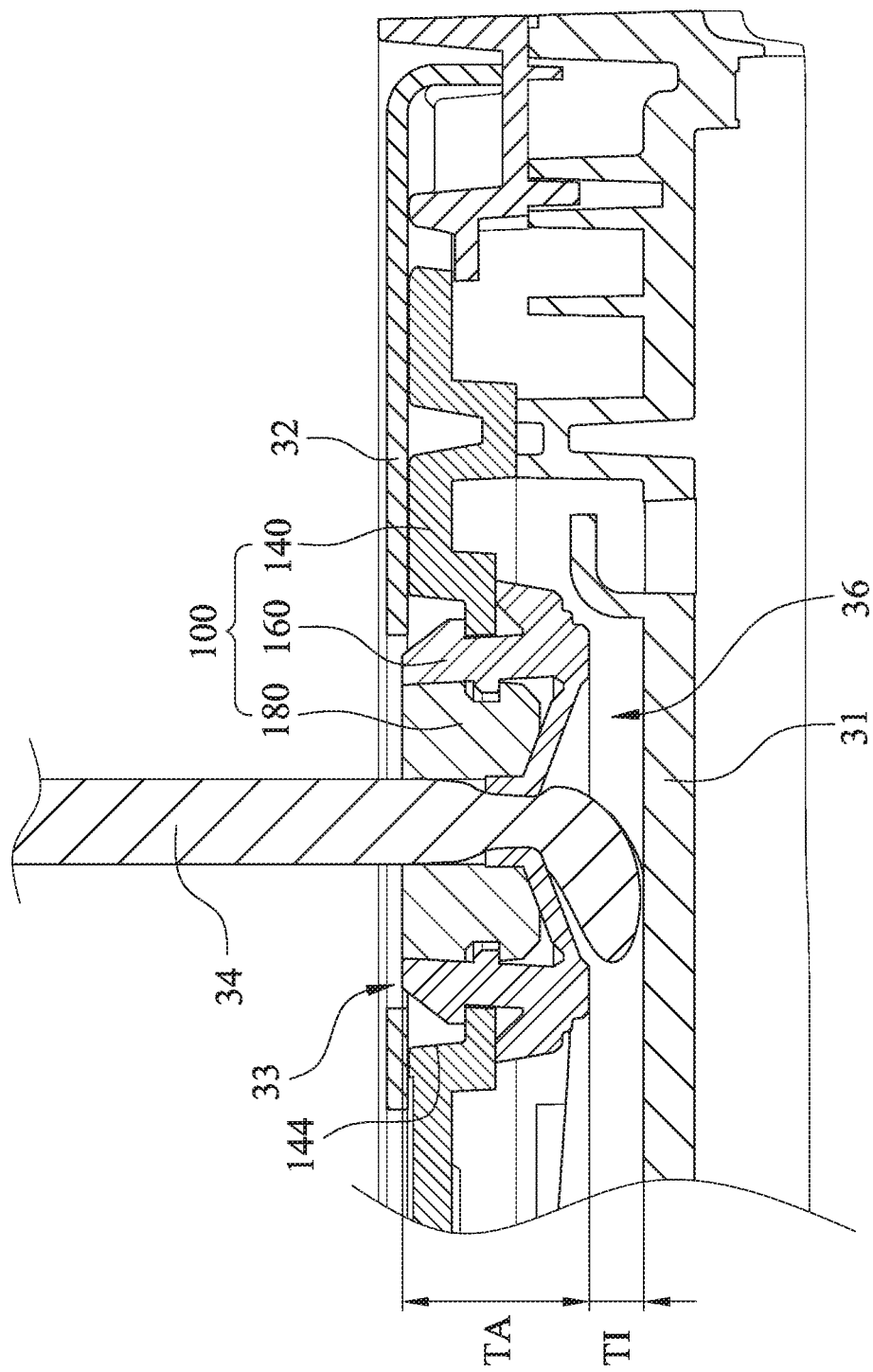

BOARD STRUCTURE AND ELECTRONIC DEVICE

RELATED APPLICATIONS

This application claims priority to Taiwan Application Serial Number 108111390, filed Mar. 29, 2019, which is herein incorporated by reference.

BACKGROUND

Technical Field

The present disclosure relates to a board structure and an electronic device. More particularly, the present disclosure relates to a board structure and an electronic device for a cable passing therethrough.

Description of Related Art

With the rapid development of various electronic devices, the reliability requirements for electronic devices are becoming more stringent, and the waterproof and dustproof standards that meet the application environment of electronic devices are one of them. In the conventional art, when the housing of the electronic device needs to be opened for cables, such as power lines or signal lines, to pass through and it should also meet the waterproof and dustproof standards, such as IP66 (Ingress Protection Rating 66, or International Protection Rating 66 so on), at the same time, the thickness of the grommet on the housing is generally much larger than the thickness of the board body of the housing, and thus the board structure provided with the grommet is difficult to apply to an electronic device with thinness. Moreover, when the cable is subjected to a sharp bend of 90 degrees immediately after passing through the board structure, the board structure is also difficult to withstand the stress generated by the sharp bending of the cable.

Therefore, nowadays, for board structures with grommet in the market, it is urgent to develop a solution that meets the required waterproof and dustproof standards and effectively reduces the thickness thereof at the same time.

SUMMARY

According to an embodiment of the present disclosure, a board structure for a cable passing therethrough includes a board body and a grommet. The board body includes a board hole and a first inner protrusion portion, and a minimum diameter of the board hole is a diameter located corresponding to the first inner protrusion portion of the board hole. The grommet is made of an elastic material and disposed in the board hole, and the grommet includes a grommet hole and an outer annular wall. The outer annular wall is connected to the first inner protrusion portion. The grommet hole is for the cable passing therethrough and coaxially disposed with the board hole, and a diameter of the grommet hole is smaller than the minimum diameter of the board hole.

According to another embodiment of the present disclosure, an electronic device includes a housing, an inner space, a cable, a processing circuit and a storage circuit. The housing includes the aforementioned board structure. The housing forms and surrounds the inner space. The cable passes through the board structure from an outer portion of the housing to the inner space. The processing circuit is disposed in the inner space and electrically connected to the cable. The storage circuit is disposed in the inner space and electrically connected to the cable.

According to further another embodiment of the present disclosure, a board structure for a cable passing therethrough includes a board body, a grommet and a supporting element. The board body includes a board hole and a first inner protrusion portion, wherein a minimum diameter of the board hole is a diameter located corresponding to the first inner protrusion portion of the board hole. The grommet is disposed in the board hole and connected to the first inner protrusion portion. The grommet includes a grommet hole and an annular groove. The grommet hole is for the cable passing therethrough and is coaxially disposed with the board hole, a diameter of the grommet hole is smaller than the minimum diameter of the board hole, and the annular groove surrounds the grommet hole. The supporting element is disposed in the annular groove and includes a supporting element hole. The supporting element hole is for the cable passing therethrough and is coaxially disposed with the board hole, and a diameter of the supporting element hole is smaller than the minimum diameter of the board hole.

BRIEF DESCRIPTION OF THE DRAWINGS

The present disclosure can be more fully understood by reading the following detailed description of the embodiment, with reference made to the accompanying drawings as follows:

FIG. 1C is another three-dimensional schematic view of the board structure according to the 1st embodiment of the present disclosure.

FIG. 1D is an exploded view according to FIG. 1C.

FIG. 2B is a three-dimensional schematic view of the board structure according to the 2nd embodiment of the present disclosure.

FIG. 2E is a cross-sectional view along the line 2E-2E in FIG. 2C.

FIG. 2F is an exploded view according to FIG. 2E.

FIG. 3C is a cross-sectional view along the line 3C-3C in FIG. 3B.

DETAILED DESCRIPTION

The embodiments will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

Figure 1A:
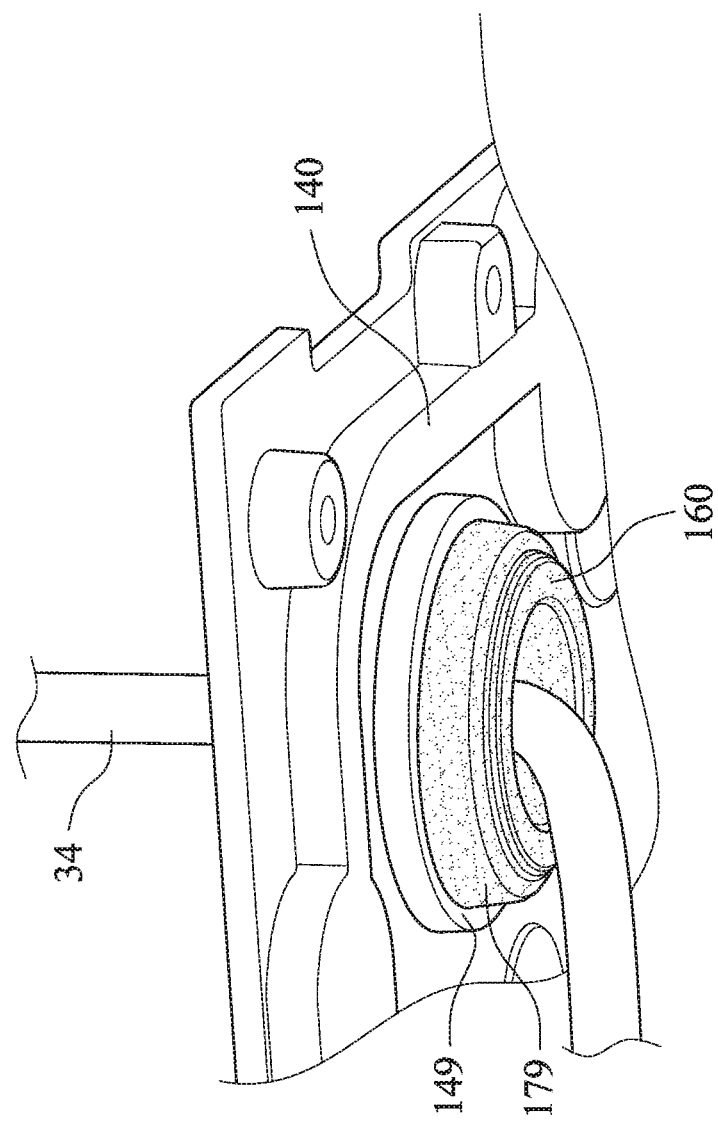
FIG. 1A is a schematic view of a usage status of a board structure according to the 1st embodiment of the present disclosure.
Figure 1B:
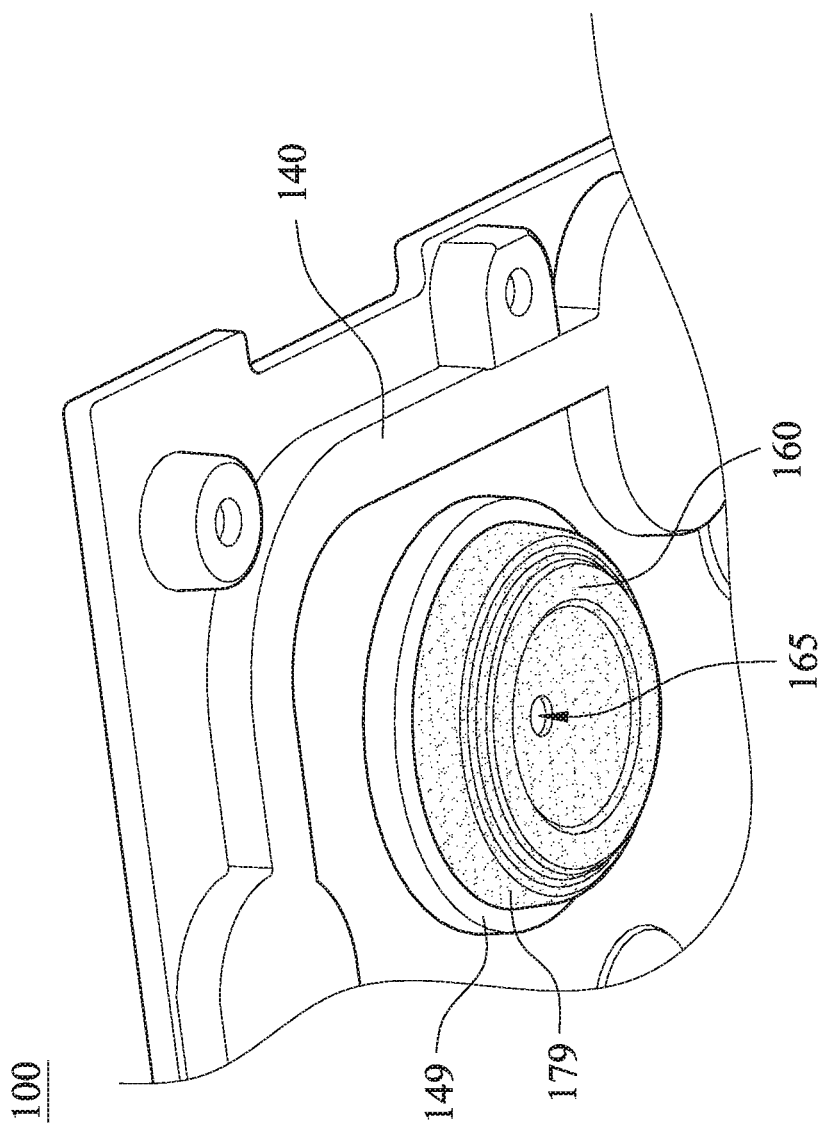
FIG. 1B is a three-dimensional schematic view of the board structure according to the 1st embodiment of the present disclosure.

FIG. 1A is a schematic view of a usage status of a board structure 100 according to the 1st embodiment of the present disclosure. FIG. 1B is a three-dimensional schematic view of the board structure 100 according to the 1st embodiment of the present disclosure. FIG. 1C is another three-dimensional schematic view of the board structure 100 according to the 1st embodiment of the present disclosure. FIG. 1D is an exploded view according to FIG. 1C. FIG. 1E is a cross-sectional view along the line 1E-1E in FIG. 1C. In FIGS. 1A to 1E, the board structure 100 is provided for a cable 34 passing therethrough. The board structure 100 includes a board body 140 and a grommet 160. In detail, the board structure 100 can be a part of a housing of an electronic device (not shown in the drawings of the 1st embodiment), wherein a side of the board structure 100 faces toward an outside of the electronic device (as shown in FIG. 1C), and the other side of the board structure 100 faces toward an inner space of the electronic device (as shown in FIG. 1B). Moreover, the cable 34 can be at least one of a power line and a signal line, and the size and the arrangement of the wire diameter of the cable 34 are not limited by FIG. 1A.

Figure 1F:
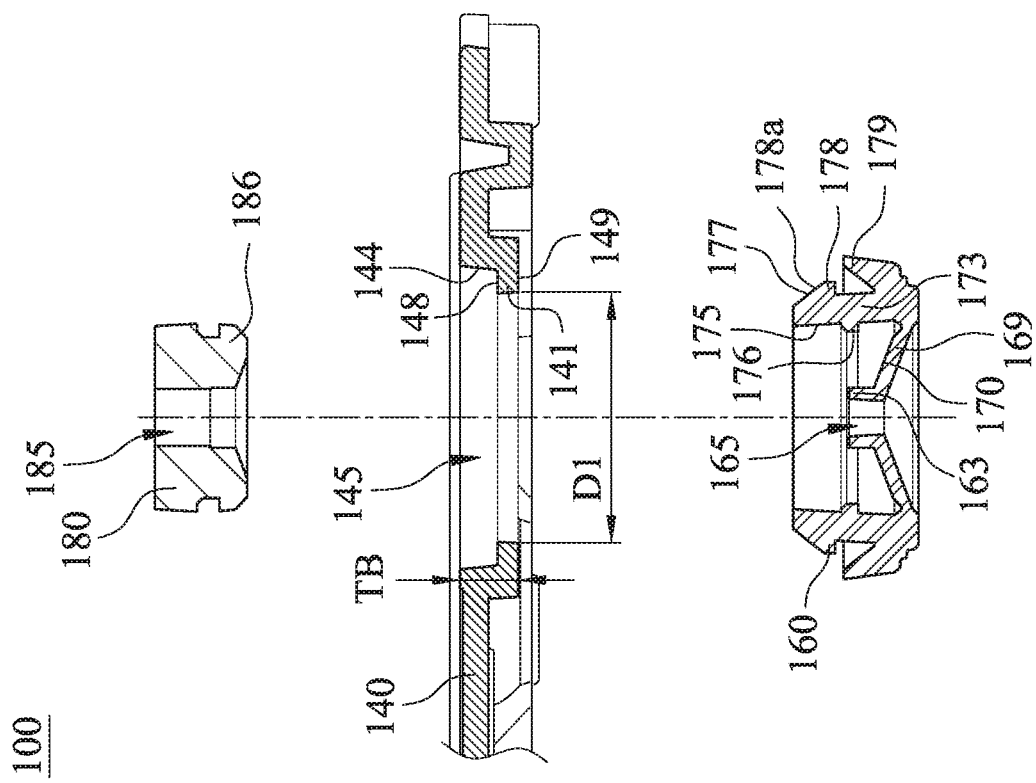
FIG. 1F is an exploded view according to FIG. 1E.
Figure 1E:
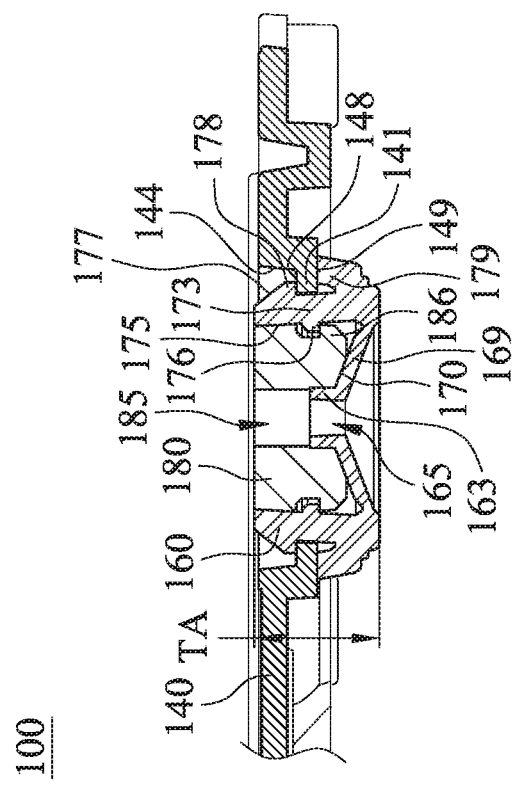
FIG. 1E is a cross-sectional view along the line 1E-1E in FIG. 1C.

FIG. 1F is an exploded view according to FIG. 1E. In FIGS. 1D and 1F, the board body 140 includes a board hole 145 and a first inner protrusion portion 141. The first inner protrusion portion 141 surrounds and forms a part of the board hole 145, and a minimum diameter D1 of the board hole 145 is a diameter located corresponding to the first inner protrusion portion 141 of the board hole 145. In detail, the board body 140 can be made of a plastic material or a metal material, and is not limited thereto. The board hole 145 is not a hole having the same diameter. Each of the first inner protrusion portion 141 and the board base 144 surrounds and forms a part of the board hole 145, so that the diameter of the board hole 145 includes the diameter of the board hole 145 corresponding to the first inner protrusion portion 141 and the board base 144, wherein a minimum diameter D1 of the board hole 145 is a diameter located corresponding to the first inner protrusion portion 141 of the board hole 145, and as shown in FIG. 1F.

In FIGS. 1E and 1F, the grommet 160 is disposed in the board hole 145 and connected to the first inner protrusion portion 141 of the board body 140. The grommet 160 includes a grommet hole 165. The grommet hole 165 is for the cable 34 passing therethrough and coaxially disposed with the board hole 145, and a diameter of the grommet hole 165 is smaller than the minimum diameter D1 of the board hole 145.

Furthermore, the grommet 160 can be made of an elastic material (such as a soft material) and a weather-resistant material. The grommet 160 includes an outer annular wall 173, and the outer annular wall 173 is connected to the first inner protrusion portion 141. Therefore, it is favorable for the board structure 100 to achieve thinness and have waterproof and dustproof effects. Moreover, the board structure with thinness (including the grommet so on) is favorable for being applied to the thin electronic devices. If the board structure has an excessive thickness, it will be difficult for the inner space of the electronic device to achieve thinness, or the board structure will occupy an excessive inner space. Therefore, the grommet 160 and the board body 140 can be connected by assembling way. The grommet 160 can be made of a rubber material or a silicone material, and is not limited thereto. According to other embodiments of the present disclosure (not shown), the grommet 160 and the board body 140 can be connected by a dual-shot injection molding or an insert injection molding, etc. The grommet 160 can be made of thermoplastic elastic materials, such as Thermoplastic Polyurethane (TPU), Thermoplastic Elastomers (TPE), and is not limited thereto.

Moreover, the grommet 160 can include an annular groove 170. The annular groove 170 surrounds the grommet hole 165. The board structure 100 can further include a supporting element 180, and the supporting element 180 is connected to the grommet 160. In detail, the supporting element 180 is disposed in the annular groove 170 and includes a supporting element hole 185. The supporting element hole 185 is for the cable 34 passing therethrough and is coaxially disposed with the board hole 145, and a diameter of the supporting element hole 185 is smaller than the minimum diameter D1 of the board hole 145. Therefore, it is favorable for preventing the grommet 160 from falling off, so that the board structure 100 is more stable, and waterproof and dustproof effects of the board structure 100 would not be affected by the movement of the cable 34, thus the space of the board structure 100 can be saved and thinness thereof can be achieved. Furthermore, according to the 1st embodiment, the board structure 100 and the board hole 145 thereof, the grommet 160 and the supporting element 180 are all circular-shaped which are symmetrical around a central axis (not shown). According to other embodiments of the present disclosure (not shown), the board structure and the board hole thereof, the grommet and the supporting element can be non-circular shaped, such as square, and is not limited thereto.

In detail, the grommet 160 can be more elastic than the supporting element 180. That is, the grommet 160 can be softer than the supporting element 180. Therefore, even if the cable 34 is sharply bent after passing through the board structure 100 (such as the bending angle is more than 90 degrees), the stress generated by the cable 34 passing through the board structure 100 with thinness can be effectively overcome, and it would not affect the waterproof and dustproof effects of the board structure 100. In detail, the supporting element 180 can be made of a rigid material, such as a plastic material or a metal material, so that the grommet 160 can be more elastic than the supporting element 180. When the supporting element 180 is made of the plastic material, the plastic material can be Polyoxymethylene (POM), Polytetrafluoroethene (PTFE), and is not limited thereto. The supporting element 180 can also be made of an elastic material, such as a rubber material, and the grommet 160 can be more elastic than the supporting element 180, and the hardness of the supporting element 180 is higher than the hardness of the grommet 160.

The grommet 160 can further include an inner annular wall 163 and a groove-bottom wall 169. The grommet hole 165 is formed on the inner annular wall 163, that is, the inner annular wall 163 surrounds and forms the grommet hole 165. The annular groove 170 is formed by the outer annular wall 173, the inner annular wall 163 and the groove-bottom wall 169, and the supporting element 180 is disposed in the annular groove 170. Therefore, it is favorable for achieving thinness and stability of the board structure 100, and the stress generated by the cable 34 passing through the board structure 100 with thinness can be effectively overcome at the same time. Moreover, both of the main body of the outer annular wall 173 and the inner annular wall 163 are parallel to a direction of a thickness TB of the board body 140 (as shown in FIG. 1F).

The groove-bottom wall 169 can be inclined away from the board body 140 along a direction from the inner annular wall 163 to the outer annular wall 173. Therefore, an inclined shape of the groove-bottom wall 169 is favorable for guiding the cable to pass through the grommet hole 165 and providing waterproof and dustproof effects at the same time, so that a wider wire diameter range of the cable is allowed to pass through the grommet hole 165 by a corner structure of the groove-bottom wall 169 and the inner annular wall 163 and an elastic material thereof.

The grommet 160 can be more elastic than the supporting element 180, and the grommet 160 is tightly connected to the cable 34. Therefore, it is favorable for the board structure 100 to meet stricter waterproof and dustproof standards. Furthermore, since the grommet 160 is made of an elastic material, the grommet 160 can be tightly connected to the cable 34, and the cable 34 can be relatively slipped corresponding to the grommet 160.

In detail, the inner annular wall 163 of the grommet 160 can be tightly connected to the cable 34. Therefore, it is favorable for achieving thinness of the board structure 100 and meeting stricter waterproof and dustproof standards.

According to the 1st embodiment, the diameter of the grommet hole 165 is smaller than the diameter of the supporting element hole 185. The diameter of the supporting element hole 185 is smaller than the minimum diameter D1 of the board hole 145. Both of the grommet hole 165 and the supporting element hole 185 are for the cable 34 passing therethrough, and the inner annular wall 163 of the grommet 160 is tightly connected to the cable 34. When the supporting element 180 is made of a rigid material or an elastic material, the supporting element 180 can be tightly connected to the cable 34 or not. Moreover, an outer annular layer of the cable 34 can be made of an elastic material.

The outer annular wall 173 of the grommet 160 can include two outer protrusion portions (such as the outer protrusion portions 178, 179). The outer protrusion portions 178, 179 are located on an outer surface 177 of the outer annular wall 173, and both of the outer protrusion portions 178, 179 are continuous annular-shaped, and the outer protrusion portions 178, 179 are tightly connected to two surfaces (such as surfaces 148, 149) of the first inner protrusion portion 141 of the board body 140 which are opposite to each other, respectively, that is, the outer protrusion portions 178, 179 of the grommet 160 are tightly connected to the surfaces 148, 149 by their elastic forces, and the outer protrusion portions 178, 179 are slightly deformed by being tightly connected to the surfaces 148, 149 in FIG. 1E. Therefore, it is favorable for the board structure 100 to achieve thinness, a convenient assembly, and meet stricter waterproof and dustproof standards, such as waterproof and dustproof standards of IP66, etc. According to the 1st embodiment, the surfaces 148, 149 of the first inner protrusion portion 141 are all perpendicular to the direction of the thickness TB of the board body 140. A maximum outer diameter of the outer protrusion portion 179 of the grommet 160 is larger than the maximum outer diameter of the outer protrusion portion 178. The outer protrusion portion 178 of the grommet 160 includes an inclined surface 178a, and it is favorable for the convenient assembling of the grommet 160.

According to other embodiment of the present disclosure (not shown), the outer protrusion portion may not be a continuous annular-shaped, for example, a plurality of the outer protrusion portions discretely arranged in an annular-shaped, or a connection method of the grommet and the first inner protrusion portion of the board body can be a screw connection which selects a suitable waterproof and dustproof design according to the application environment of the electronic device.

The outer annular wall 173 of the grommet 160 includes a fixing portion 176. The fixing portion 176 is located on an inner surface 175 of the outer annular wall 173, and the fixing portion 176 is engaged with a support fixing portion 186 of the supporting element 180. Therefore, it is favorable for the grommet 160 and the supporting element 180 to meet the requirements of the thin board structure 100.

In FIGS. 1E and 1F, an assembling thickness of the grommet 160 and the supporting element 180 is TA. A thickness of the board body 140 is TB, wherein the thickness TB refers to a thickness of the first inner protrusion portion 141 to the board base 144, and the following condition is satisfied: TA/TB≤4. Therefore, it is favorable for the board structure 100 to achieve thinness. Furthermore, the following condition is satisfied: 0.8≤TA/TB≤3. Moreover, the following condition is satisfied: 0.8≤TA/TB≤2.5.

In FIG. 1E, the assembling thickness TA of the grommet 160 and the supporting element 180 can be further protruded from the board body 140 on a side closer to the groove-bottom wall 169 (such as a lower side of FIG. 1E, which is also shown in FIG. 1B) than on the other side far away from the groove-bottom wall 169 (such as a upper side of FIG. 1E, which is also shown in FIG. 1C). Therefore, when the board body 140 is a part of the housing of the electronic device, it is favorable for maintaining a flatness of the board body 140 on the side away from the groove-bottom wall 169, so as to achieve the board body 140 with thinness without affecting the flatness of the housing of the electronic device at the same time.

An overlap ratio of the assembling thickness TA of the grommet 160 and the supporting element 180 to the thickness TB of the board body 140 is PS, that is, in the thickness TB of the board body 140, the overlap ratio of the assembling thickness TA of the grommet 160 and the supporting element 180 and the thickness TB of the board body 140 is PS, and the following condition is satisfied: 0.5≤PS≤1. Therefore, it is favorable for achieving thinness and stability of the board structure 100. Furthermore, the following condition is satisfied: 0.75≤PS≤1. Moreover, the following condition is satisfied: 0.85≤PS≤1. PS=1 represents that the board body 140 is completely overlapped with the assembling thickness TA, that is, it is favorable for providing the effect of the optimal thinness.

In Table 1, the data of the foregoing parameters of the board structure 100 according to the 1st embodiment of the present disclosure are listed, which are illustrated in FIGS. 1E and 1F.

TABLE 1

| the 1st embodiment | | | |
|---|---|---|---|
| D1 (mm) | 22.06 | TA/TB | 2.16 |
| TA (mm) | 11.00 | PS | 1 |
| TB (mm) | 5.10 | | |

Figure 2A:
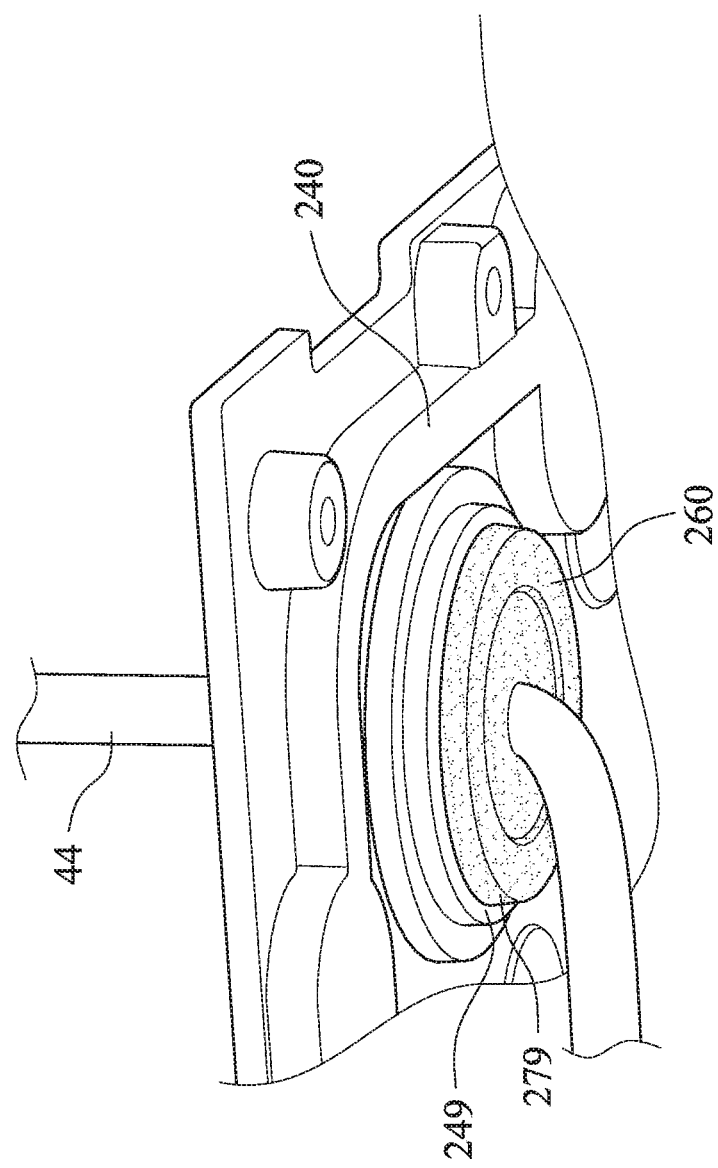
FIG. 2A is a schematic view of a usage status of a board structure according to the 2nd embodiment of the present disclosure.
Figure 2D:
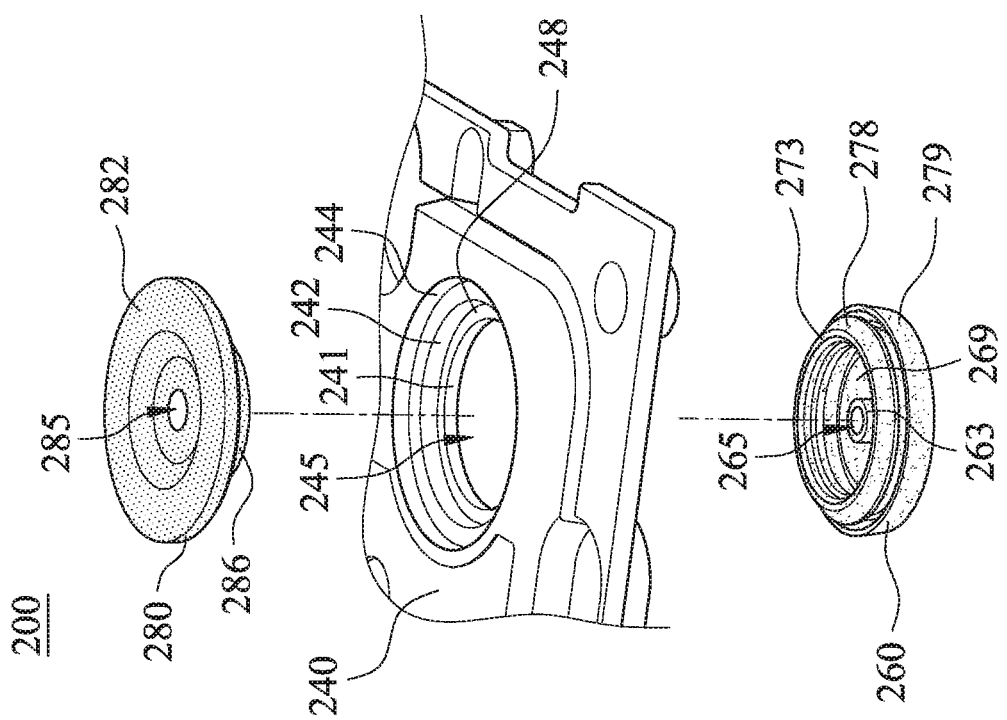
FIG. 2D is an exploded view according to FIG. 2C.
Figure 2C:
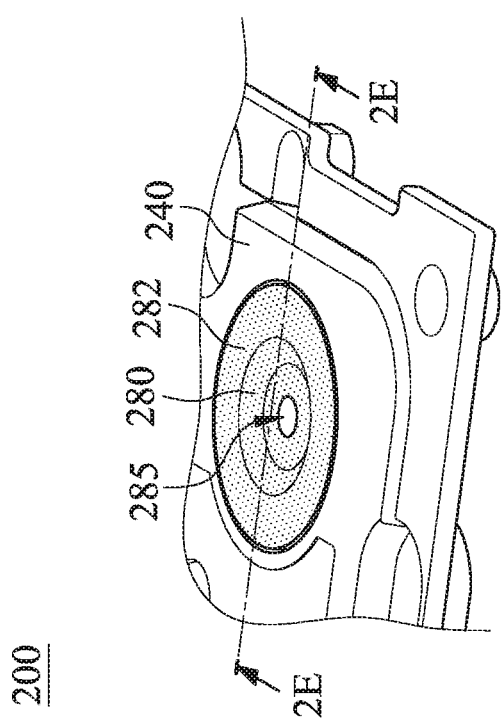
FIG. 2C is another three-dimensional schematic view of the board structure according to the 2nd embodiment of the present disclosure.

FIG. 2A is a schematic view of a usage status of a board structure 200 according to the 2nd embodiment of the present disclosure. FIG. 2B is a three-dimensional schematic view of the board structure 200 according to the 2nd embodiment of the present disclosure. FIG. 2C is another three-dimensional schematic view of the board structure 200 according to the 2nd embodiment of the present disclosure. FIG. 2D is an exploded view according to FIG. 2C. FIG. 2E is a cross-sectional view along to the line 2E-2E in FIG. 2C. In FIGS. 2A to 2E, the board structure 200 is provided for a cable 44 passing therethrough. The board structure 200 includes a board body 240 and a grommet 260. In detail, the board structure 200 can be a part of a housing of an electronic device (not shown in the drawings of the 2nd embodiment), wherein a side of the board structure 200 faces toward the outside of the electronic device (as shown in FIG. 2C), and the other side of the device structure 200 faces toward the inner space of the electronic device (as shown in FIG. 2B).

FIG. 2F is an exploded view according to FIG. 2E. In FIGS. 2D and 2F, the board body 240 includes a board hole 245 and a first inner protrusion portion 241. The first inner protrusion portion 241 surrounds and forms a part of the board hole 245, and a minimum diameter D1 of the board hole 245 is a diameter located corresponding to the first inner protrusion portion 241 of the board hole 245. In detail, the board hole 245 is not a hole having the same diameter. Each of the first inner protrusion portion 241, a second inner protrusion portion 242 and the board base 244 surrounds and forms a part of the board hole 245, so that the diameter of the board hole 245 includes the diameter of the first inner protrusion portion 241, the diameter of the second inner protrusion portion 242 and the diameter of the board base 244 corresponding to the board hole 245, wherein a minimum diameter D1 of the board hole 245 is a diameter of the board hole 245 corresponding to the first inner protrusion portion 241, and as shown in FIG. 2F.

In FIGS. 2E and 2F, the grommet 260 is disposed in the board hole 245 and connected to the first inner protrusion portion 241 of the board body 240. The grommet 260 includes a grommet hole 265. The grommet hole 265 is for the cable 44 passing therethrough and coaxially disposed with the board hole 245, and a diameter of the grommet hole 265 is smaller than the minimum diameter D1 of the board hole 245.

Furthermore, the grommet 260 can be made of an elastic material and a weather-resistant material. The grommet 260 includes an outer annular wall 273, and the outer annular wall 273 is connected to the first inner protrusion portion 241.

Furthermore, the grommet 260 includes an annular groove 270. The annular groove 270 surrounds the grommet hole 265. The board structure 200 can further include a supporting element 280, and the supporting element 280 is connected to the grommet 260. In detail, the supporting element 280 is disposed in the annular groove 270 and includes a supporting element hole 285. The supporting element hole 285 is for the cable 44 passing therethrough and is coaxially disposed with the board hole 245, and a diameter of the supporting element hole 285 is smaller than the minimum diameter D1 of the board hole 245. Therefore, the board structure 200 and the board hole 245 thereof, the grommet 260 and the supporting element 280 are all a circular-shaped of a symmetrical central axis (not shown) in the 2nd embodiment.

According to the 2nd embodiment, the grommet 260 is more elastic than the supporting element 280, and the grommet 260 is tightly connected to the cable 44. In detail, the inner annular wall 263 of the grommet 260 is tightly connected to the cable 44. The supporting element 280 can be made of a rigid material, so that the grommet 260 is more elastic than the supporting element 280. The grommet 280 can also be made of an elastic material, and the grommet 260 is more elastic than the supporting element 280. The grommet 260 is tightly connected to the cable 44 because the grommet 260 is made of an elastic material, and the cable 44 can relatively slip corresponding to the grommet 260.

Furthermore, the diameter of the grommet hole 265 is smaller than the diameter of the supporting element hole 285. The diameter of the supporting element hole 285 is smaller than the minimum diameter D1 of the board hole 245. The grommet hole 265 and the supporting element hole 285 are all for the cable 44 passing therethrough, and the inner annular wall 263 of the grommet 260 is tightly connected to the cable 44. When the supporting element 280 is made of a rigid material, the supporting element 280 can be tightly connected to the cable 44 or not. When the supporting element 280 is made of an elastic material, the supporting element 280 can be tightly connected to the cable 44 or not. Moreover, an outer annular layer of the cable 44 can be made of an elastic material.

The grommet 260 further includes an inner annular wall 263 and a groove-bottom wall 269. The grommet hole 265 is formed by the inner annular wall 263, that is, the inner annular wall 263 surrounds and forms the grommet hole 265. The outer annular wall 273, the inner annular wall 263 and the groove-bottom wall 269 form the annular groove 270, and the supporting element 280 is disposed in the annular groove 270. Moreover, the main body of the outer annular wall 273 and the inner annular wall 263 are all parallel to a direction of a thickness TB of the board body 240 (as shown in the direction of the thickness TB of the board body 240 in FIG. 2F).

The groove-bottom wall 269 is parallel to the board body 240 (which is perpendicular to the direction of the thickness TB of the board body 240). Therefore, it is more favorable for achieving thinness the board structure 200.

The outer annular wall 273 of the grommet 260 includes outer protrusion portions 278, 279. The outer protrusion portions 278, 279 are located on an outer surface 277 of the outer annular wall 273 and all are continuous annular-shaped, and the outer protrusion portions 278, 279 are tightly connected to opposite two surfaces 248, 249 of the first inner protrusion portion 241 of the board body 240, respectively, that is, the outer protrusion portions 278, 279 of the grommet 260 are tightly connected to the surfaces 248, 249 by their elastic forces, and the outer protrusion portions 278, 279 are slightly deformed by being tightly connected to the surfaces 248, 249 in FIG. 2E. According to the 2nd embodiment, the surfaces 248, 249 of the first inner protrusion portion 241 are all perpendicular to the direction of the thickness TB of the board body 240. A maximum outer diameter of the outer protrusion portion 279 of the grommet 260 is larger than the maximum outer diameter of the outer protrusion portion 278. The outer protrusion portion 278 of the grommet 260 includes an inclined surface 278a.

The outer annular wall 273 of the grommet 260 includes a fixing portion 276. The fixing portion 276 is located on an inner surface 275 of the outer annular wall 273, and the fixing portion 276 is engaged with a support fixing portion 286 of the supporting element 280.

The supporting element 280 further includes an extension portion 282 being annular-shaped and located on a side of the supporting element 280 which is away from the groove-bottom wall 269. Therefore, it is favorable for the board structure 200 to meet stricter waterproof and dustproof standards, such as waterproof and dustproof standards of IP66, etc. When the board structure 200 encounters water splashing, the extension portion 282 can be the first protection for blocking water splashing.

The board body 240 further includes a second inner protrusion portion 242 which is connected to the extension portion 282 of the supporting element 280. Therefore, it is favorable for the supporting element 280 and the extension portion 282 thereof to be more securely assembled in the board structure 200.

In FIG. 2E, the assembling thickness TA of the grommet 260 and the supporting element 280 can be further protruded from the board body 240 on a side closer to the groove-bottom wall 269 (such as a lower side of FIG. 2E, which is also shown in FIG. 2B) than on the other side far away from the groove-bottom wall 269 (such as a upper side of FIG. 2E, which is also shown in FIG. 2C).

In Table 2, the data of the foregoing parameters of the board structure 200 according to the 2nd embodiment of the present disclosure are listed, which are illustrated in FIGS. 2E and 2F.

TABLE 2

| the 2nd embodiment | | | |
|---|---|---|---|
| D1 (mm) | 23.00 | TA/TB | 1.41 |
| TA (mm) | 8.87 | PS | 1 |
| TB (mm) | 6.30 | | |

Figure 3A:
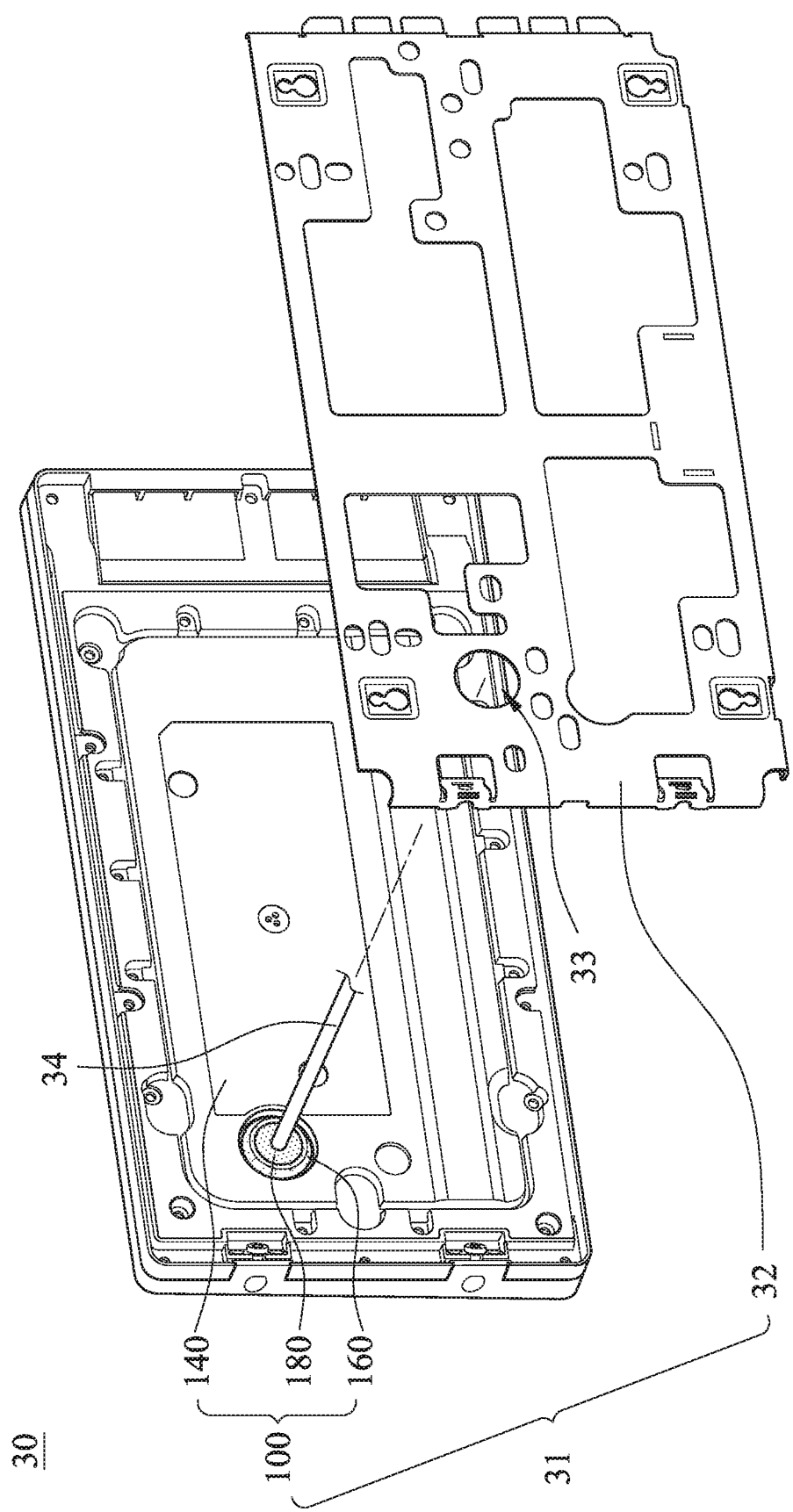
FIG. 3A is a three-dimensional schematic view of the electronic device according to the 3rd embodiment of the present disclosure.
Figure 3B:
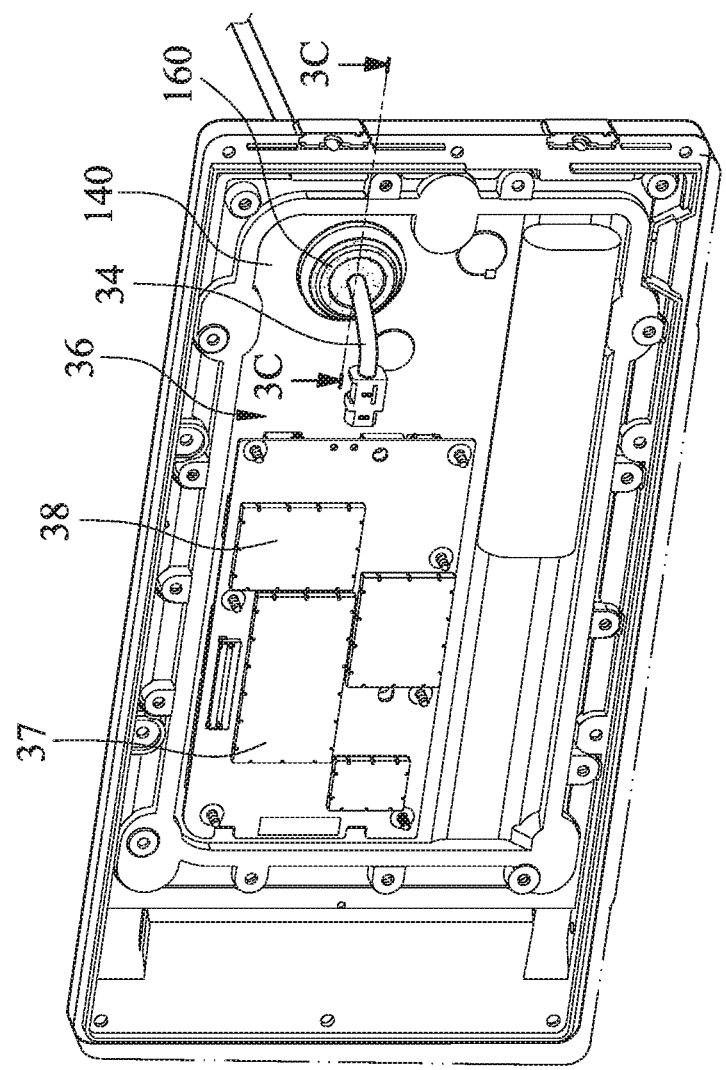
FIG. 3B is another three-dimensional schematic view of the electronic device according to the 3rd embodiment of the present disclosure.

FIG. 3A is a three-dimensional schematic view of an electronic device 30 according to the 3rd embodiment of the present disclosure. FIG. 3B is another three-dimensional schematic view of the electronic device 30 according to the 3rd embodiment of the present disclosure. FIG. 3C is a cross-sectional view along the line 3C-3C in FIG. 3B. In FIGS. 3A to 3C, the electronic device 30 includes a housing 31, an inner space 36, a cable 34, a processing circuit 37 and a storage circuit 38. The housing 31 includes the board structure 100 of the 1st embodiment. The details of the board structure 100 are the same with the contents of the aforementioned 1st embodiment, and are not described again herein. The housing 31 forms and surrounds the inner space 36. The cable 34 passes through the board structure 100 from an outer portion of the housing 31 to the inner space 36, that is, the cable 34 passes through the board structure 100 from the inner space 36 to the outer portion of the housing 31. The processing circuit 37 is disposed in the inner space 36 and is electrically connected to the cable 34. The storage circuit 38 is disposed in the inner space 36 and is electrically connected to the processing circuit 37 and the cable 34. Therefore, it is favorable for meeting the design requirements of the housing 31 of the electronic device 30 with thinness.

In detail, the board structure 100 is a part of the housing 31, wherein a side of the board structure 100 away from the groove-bottom wall 169 faces toward the outer portion of the electronic device 30 (such as a upper side of FIG. 1E, which is also shown in FIGS. 10 and 3A). The side of the board structure 100 close to the groove-bottom wall 169 faces toward the inner space 36 of the electronic device 30 (such as a lower side of FIG. 1E, which is also shown in FIGS. 1B and 3B). The board structure 100 further includes a bracket 32 (the bracket 32 is shown in an exploded view in FIG. 3A to more clearly show the board structure 100 and the bracket 32). The bracket 32 is connected to the outer portion of the board structure 140, and a diameter of a bracket hole 33 is smaller than the diameter of the board hole 145 corresponding to the board base 144 (as shown in FIG. 3C) for preventing the grommet 160 and the support element 180 from falling off. Furthermore, the cable 34 can be at least one of a power line and a signal line. The processing circuit 37 and the storage circuit 38 can be indirectly electrically connected to the cable 34 through a circuit board, electronic components and connectors, etc. (as shown in FIG. 3B), or the processing circuit 37, the storage circuit 38 and the cable 34 can be directly electrically connected to each other.

In FIG. 3C, a thickness of the inner space 36 of the electronic device 30 is TI. The assembling thickness of the grommet 160 and the supporting element 180 is TA, wherein a direction of the thickness TI is parallel to the assembling thickness TA (such as the direction of the thickness TB). The thickness TI is in the inner space 36, and is a distance between an end point of the side of the board structure 100 toward the inner space 36 and the housing 31 along the direction of the assembling thickness TA, and the following condition is satisfied: 0.05≤TI/TA. Therefore, the stress generated by the cable 34 passing through the board structure 100 with thinness can be effectively overcome, and it does not affect waterproof and dustproof effects of the board structure 100, which is favorable for the board structure 100 to apply in the thin inner space 36. Furthermore, the following condition is satisfied: 0.05≤TI/TA≤2.

Figure 3D:
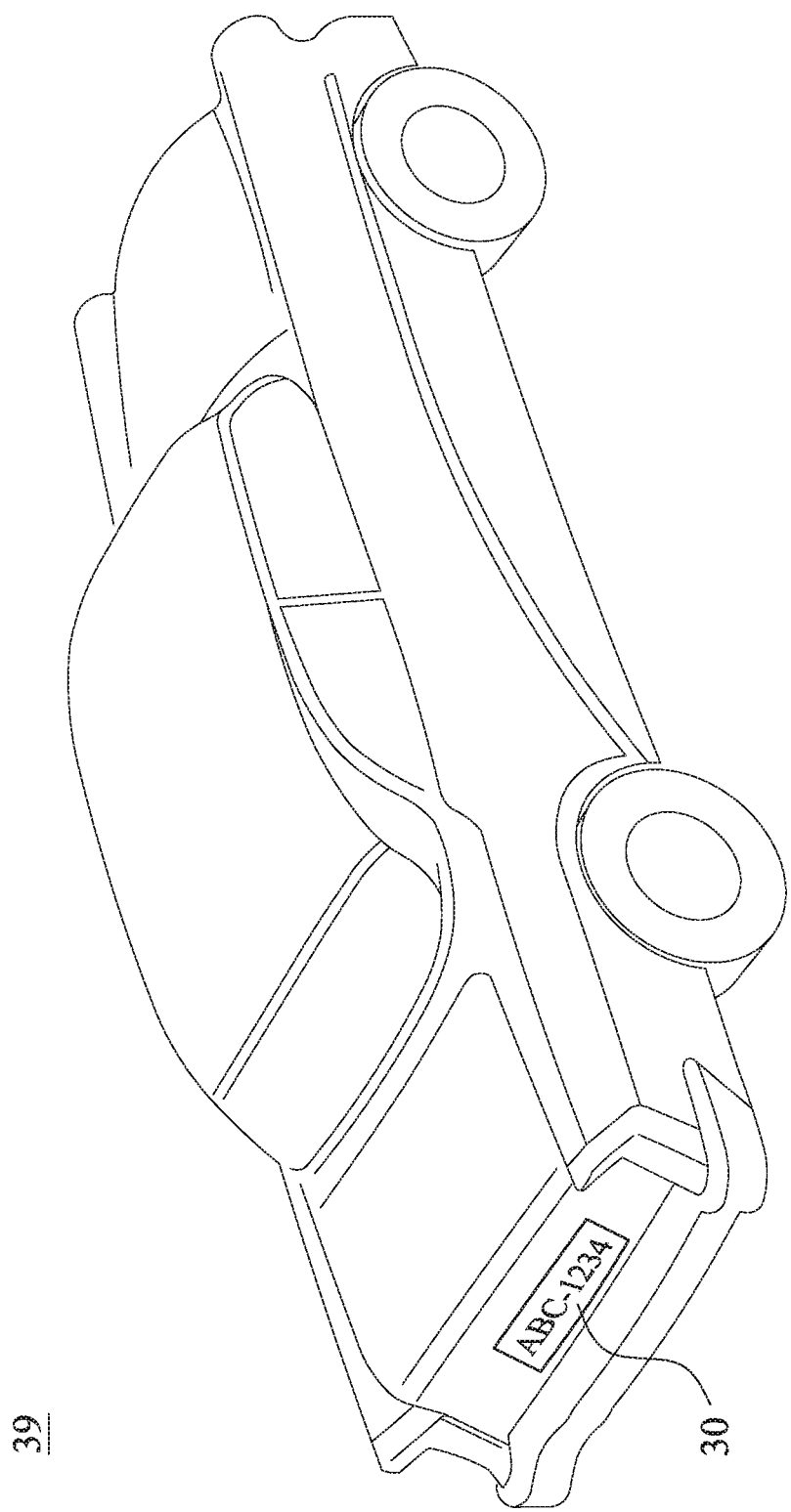
FIG. 3D is a schematic view of a usage status of the electronic device according to the 3rd embodiment of the present disclosure.

FIG. 3D is a schematic view of a usage status of the electronic device 30 according to the 3rd embodiment of the present disclosure. In FIG. 3D, the electronic device 30 can be an electronic vehicle identification. Therefore, the electronic device 30 provided with the board structure 100 is favorable for meeting usage requirements of the thin inner space 36 and waterproof and dustproof. In detail, the electronic device 30 is mounted on a back side of a vehicle 39, and the side of electronic device 30 mounted and connected to the vehicle 39 is the side as shown in FIG. 3A. The cable 34 is electrically connected to the electronic device 30 and a controller of the vehicle 39. The side of the electronic device 30 facing toward the back side of the vehicle 39 and displaying license plate information is the side as shown in FIG. 3B. Moreover, the electronic device according to the present disclosure is not limited to an electronic vehicle identification, and it can be a thin or non-thin electronic device.

In Table 3, the data of the foregoing parameters of the electronic device 30 according to the 3rd embodiment of the present disclosure are listed, which are illustrated in FIGS. 1E and 3C.

TABLE 3

| the 3rd embodiment | | | |
|---|---|---|---|
| TI (mm) | 3.20 | TI/TA | 0.29 |
| TA (mm) | 11.00 | | |

Figure 4A:
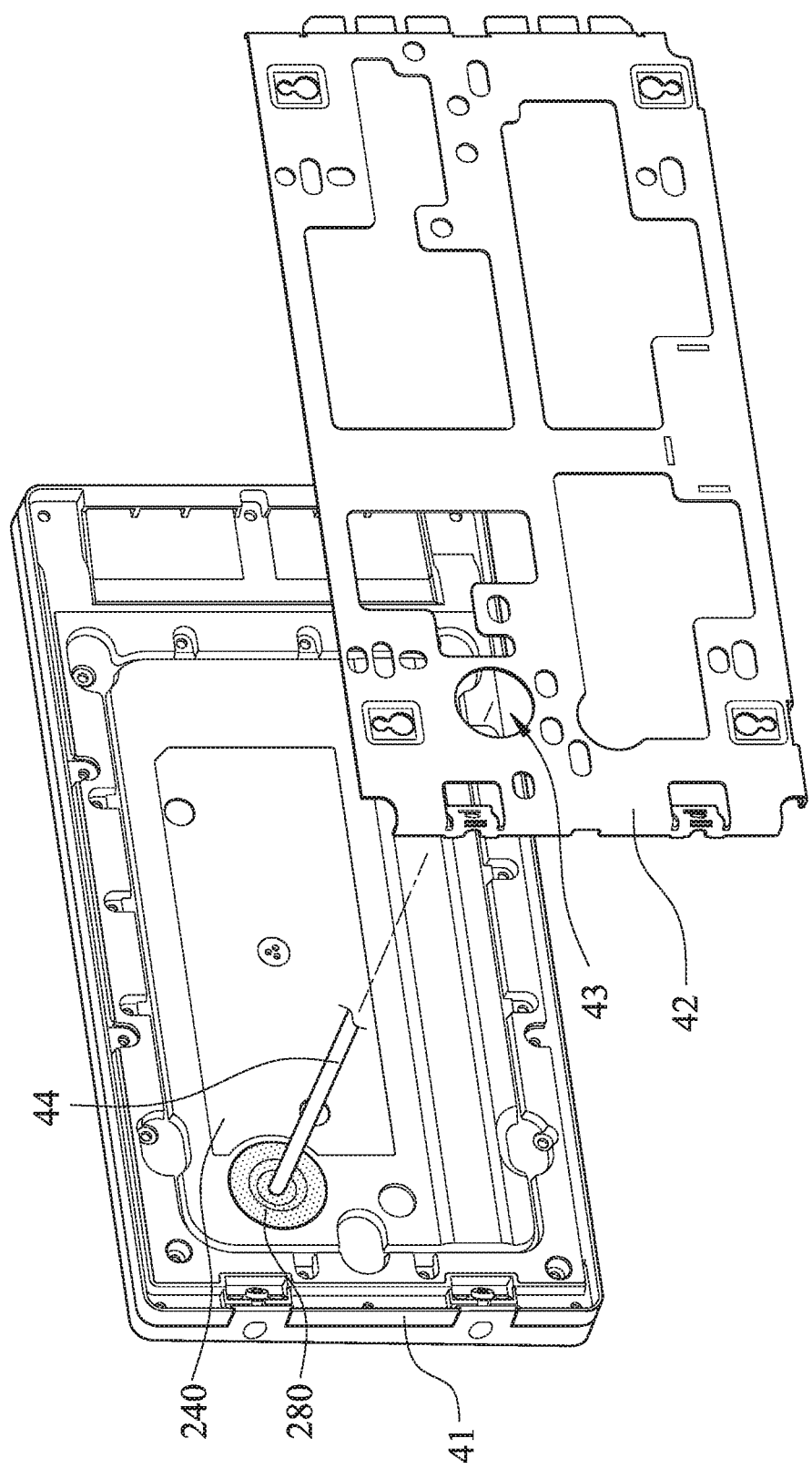
FIG. 4A is a three-dimensional schematic view of the electronic device according to the 4th embodiment of the present disclosure.
Figure 4B:
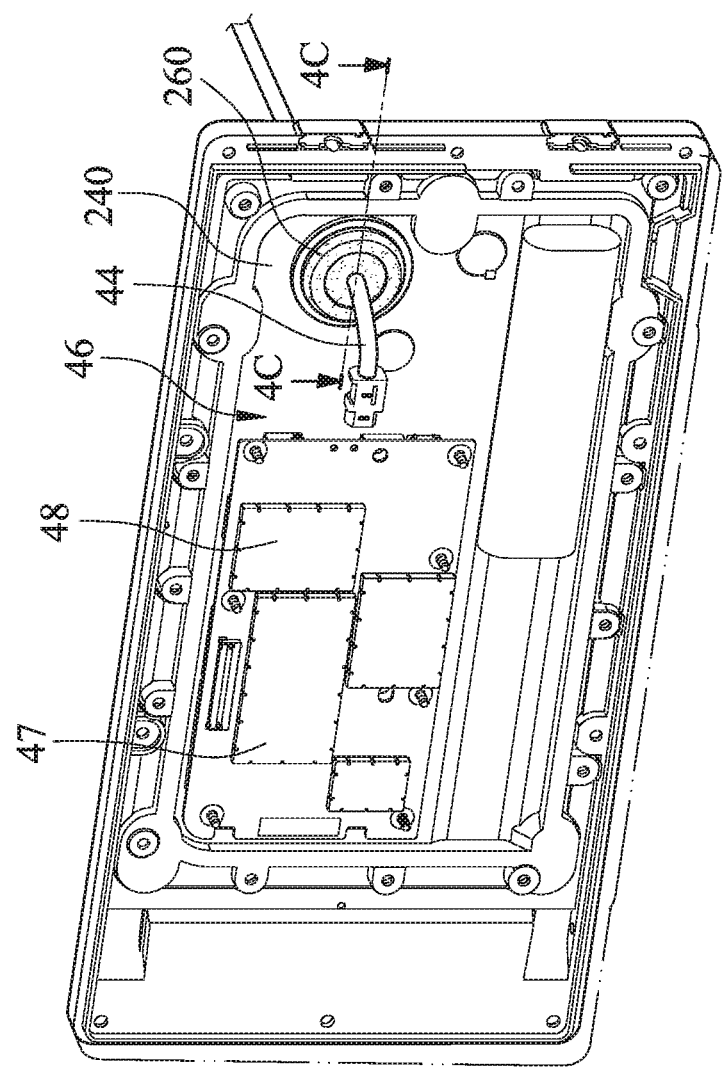
FIG. 4B is another three-dimensional schematic view of the electronic device according to the 4th embodiment of the present disclosure.
Figure 4C:
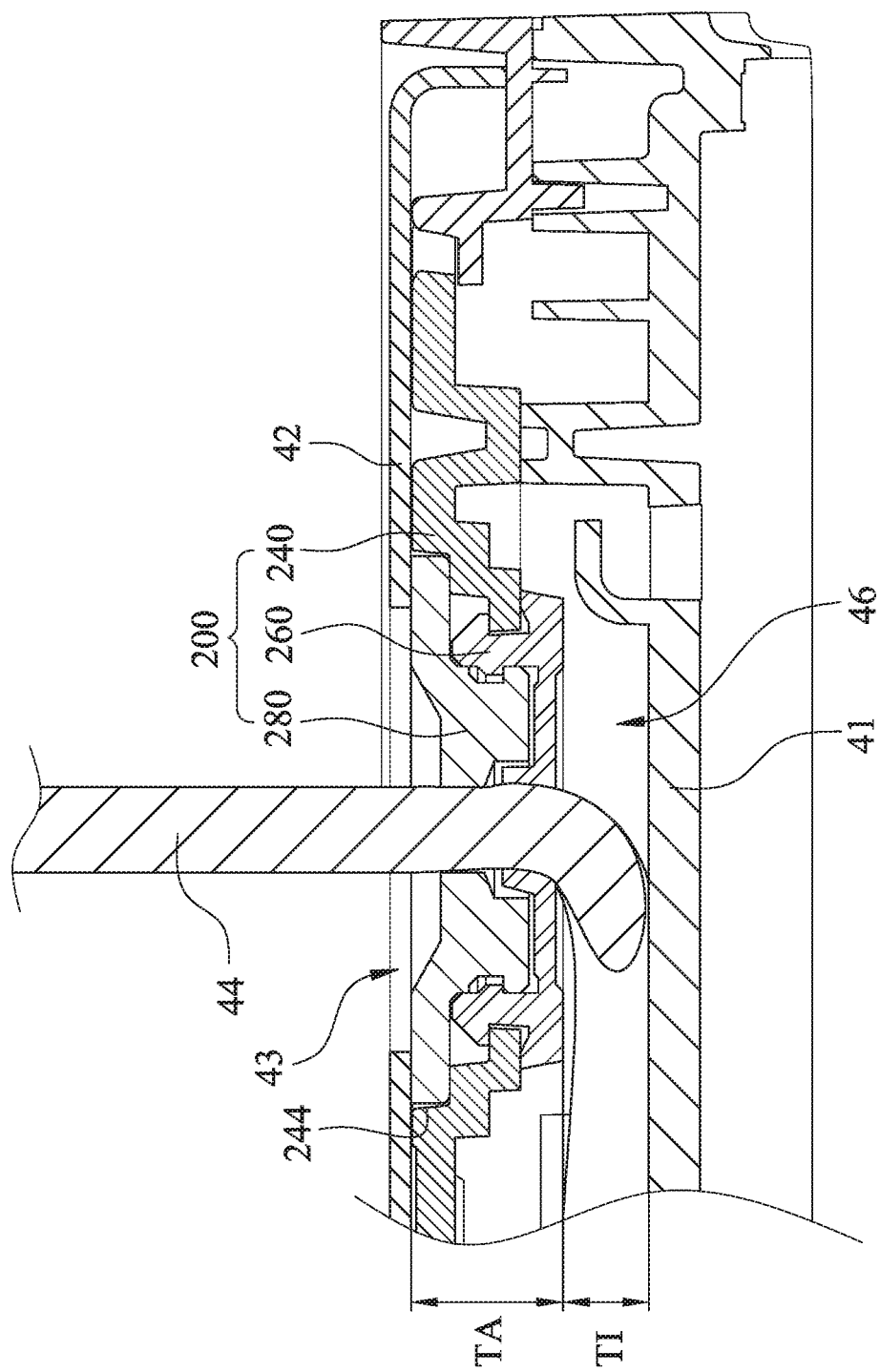
FIG. 4C is a cross-sectional view along the line 4C-4C in FIG. 4B.

FIG. 4A is a three-dimensional schematic view of the electronic device 40 according to the 4th embodiment of the present disclosure. FIG. 4B is another three-dimensional schematic view of the electronic device 40 according to the 4th embodiment of the present disclosure. FIG. 4C is a cross-sectional view along the line 4C-4C in FIG. 4B. In FIGS. 4A and 4C, the electronic device 40 includes a housing 41, an inner space 46, the cable 44, a processing circuit 47 and a storage circuit 48. The housing 41 includes the board structure 200 of the 2nd embodiment. The details of the board structure 200 are the same with the contents of the aforementioned 2nd embodiment, and are not described again herein. The housing 41 forms and surrounds the inner space 46. The cable 44 passes through the board structure 200 from an outer portion of the housing 41 to the inner space 46. The processing circuit 47 is disposed in the inner space 46 and is electrically connected to the cable 44. The storage circuit 48 is disposed in the inner space 46 and is electrically connected to the cable 44.

In detail, the board structure 200 is a part of the housing 41, wherein a side of the board structure 200 away from the groove-bottom wall 269 faces toward the outer portion of the electronic device 40 (such as a upper side of FIG. 2E, which is also shown in FIGS. 2C and 4A). The side of the board structure 200 close to the groove-bottom wall 269 faces toward the inner space 46 of the electronic device 40 (such as a lower side of FIG. 2E, which is also shown in FIGS. 2B and 4B). The board structure 200 further includes a bracket 42 (the bracket 42 is shown in an exploded view in FIG. 4A to more clearly show the board structure 200 and the bracket 42). The bracket 42 is connected to the outer portion of the board structure 240, and a diameter of a bracket hole 43 is smaller than the diameter of the board hole 245 corresponding to the board base 244 (as shown in FIG. 4C).

Moreover, the electronic device 40 can be an electronic vehicle identification, or it can be a thin or non-thin electronic device.

In Table 4, wherein the table lists the data according to the parameters of the electronic device 40 of the 4th embodiment of the present disclosure. The definition of each of the parameters is the same as that of the electronic device 30 of the 3rd embodiment, and it is illustrated in FIGS. 2E and 4C.

TABLE 4

| the 4th embodiment | | | |
|---|---|---|---|
| TI (mm) | 4.97 | TI/TA | 0.56 |
| TA (mm) | 8.87 | | |

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A board structure, for a cable passing therethrough, the board structure comprising:
   a board body comprising a board hole and a first inner protrusion portion, wherein a minimum diameter of the board hole is a diameter located corresponding to the first inner protrusion portion of the board body;
   a grommet made of an elastic material and disposed in the board hole, wherein the grommet comprises a grommet hole, an outer annular wall, an inner annular wall, a groove-bottom wall and an annular groove, the outer annular wall is connected to the first inner protrusion portion, the grommet hole is for the cable passing therethrough and coaxially disposed with the board hole, a diameter of the grommet hole is smaller than the minimum diameter of the board hole, the grommet hole is formed on the inner annular wall, the annular groove is formed by the outer annular wall, the inner annular wall and the groove-bottom wall, and the supporting element is disposed in the annular groove; and
   a supporting element connected to the grommet and comprising a supporting element hole, wherein the grommet is more elastic than the supporting element, the supporting element hole is for the cable passing therethrough and coaxially disposed with the board hole, and a diameter of the supporting element hole is smaller than the minimum diameter of the board hole.

2. The board structure of claim 1, wherein the groove-bottom wall is inclined away from the board body along a direction from the inner annular wall to the outer annular wall.

3. The board structure of claim 1, wherein the groove-bottom wall is parallel to the board body.

4. The board structure of claim 1, wherein the outer annular wall of the grommet comprises two outer protrusion portions, the outer protrusion portions are located on an outer surface of the outer annular wall, and the outer protrusion portions are respectively connected to two opposite surfaces of the first inner protrusion portion of the board body.

5. The board structure of claim 1, wherein the outer annular wall of the grommet comprises a fixing portion, the fixing portion is located on an inner surface of the outer annular wall, and the fixing portion is engaged with the supporting element.

6. The board structure of claim 1, wherein the supporting element further comprises an extension portion being annular-shaped and located on a side of the supporting element which is away from the groove-bottom wall.

7. The board structure of claim 6, wherein the board body further comprises a second inner protrusion portion, which is connected to the extension portion of the supporting element.

8. The board structure of claim 1, wherein an assembling thickness of the grommet and the supporting element is TA, a thickness of the board body is TB, and the following condition is satisfied:

$$TA/TB \leq 4.$$

9. The board structure of claim 1, wherein an overlap ratio of an assembling thickness of the grommet and the supporting element to a thickness of the board body is PS, and the following condition is satisfied:

$$0.5 \leq PS \leq 1.$$

10. An electronic device, comprising:
a housing comprising the board structure of claim 1;
an inner space, wherein the housing forms and surrounds the inner space;
the cable passing through the board structure from an outer portion of the housing to the inner space;
a processing circuit disposed in the inner space and electrically connected to the cable; and
a storage circuit disposed in the inner space and electrically connected to the cable.

11. The electronic device of claim 10, wherein a thickness of the inner space is TI, an assembling thickness of the grommet and the supporting element is TA, and the following condition is satisfied:

$0.05 \leq TI/TA$.

12. The electronic device of claim 10, wherein the electronic device is an electronic vehicle identification.

13. A board structure, for a cable passing therethrough, the board structure comprising:
a board body comprising a board hole and a first inner protrusion portion, wherein a minimum diameter of the board hole is a diameter located corresponding to the first inner protrusion portion of the board body;
a grommet disposed in the board hole and connected to the first inner protrusion portion, wherein the grommet comprises a grommet hole and an annular groove, the grommet hole is for the cable passing therethrough and is coaxially disposed with the board hole, a diameter of the grommet hole is smaller than the minimum diameter of the board hole, and the annular groove surrounds the grommet hole; and
a supporting element disposed in the annular groove and comprising a supporting element hole, wherein the supporting element hole is for the cable passing therethrough and is coaxially disposed with the board hole, and a diameter of the supporting element hole is smaller than the minimum diameter of the board hole;
wherein the grommet is more elastic than the supporting element, and the grommet is tightly connected to the cable.

14. The board structure of claim 13, wherein an assembling thickness of the grommet and the supporting element is TA, a thickness of the board body is TB, and the following condition is satisfied:

$TA/TB \leq 4$.

* * * * *